United States Patent
Diaz et al.

(10) Patent No.: US 8,992,689 B2
(45) Date of Patent: Mar. 31, 2015

(54) METHOD FOR REMOVING HALOGEN-CONTAINING RESIDUES FROM SUBSTRATE

(75) Inventors: Adauto Diaz, Saratoga, CA (US); Andrew Nguyen, San Jose, CA (US); Benjamin Schwarz, San Jose, CA (US); Eu Jin Lim, Sunnyvale, CA (US); Jared Ahmad Lee, Santa Clara, CA (US); James P. Cruse, Soquel, CA (US); Li Zhang, Mountain View, CA (US); Scott M. Williams, Sunnyvale, CA (US); Xiaoliang Zhuang, Santa Clara, CA (US); Zhuang Li, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 337 days.

(21) Appl. No.: 13/408,703

(22) Filed: Feb. 29, 2012

(65) Prior Publication Data

US 2012/0222699 A1    Sep. 6, 2012

Related U.S. Application Data

(60) Provisional application No. 61/448,032, filed on Mar. 1, 2011.

(51) Int. Cl.
*B08B 5/00* (2006.01)
*H01J 37/32* (2006.01)
*H01L 21/67* (2006.01)

(52) U.S. Cl.
CPC ..... *H01J 37/32357* (2013.01); *H01L 21/67201* (2013.01)
USPC .................. 134/1.2; 134/1.1; 216/67

(58) Field of Classification Search
CPC ...... B08B 7/00; B08B 7/0035; B08B 7/0071; H01L 21/67069; H01L 21/02063; H01L 21/31138; H01L 21/02041; H01L 21/02046; H01L 21/31116; C23C 16/4405; Y10S 438/905
USPC .......................... 134/1.1, 1.2, 902
See application file for complete search history.

(56) References Cited

U.S. PATENT DOCUMENTS

| | | | |
|---|---|---|---|
| 4,816,638 A * | 3/1989 | Ukai et al. ............... | 219/121.43 |
| 4,952,299 A | 8/1990 | Chrisos et al. | |
| 5,071,714 A | 12/1991 | Rodbell et al. | |
| 5,188,979 A | 2/1993 | Filipiak | |
| 5,198,634 A * | 3/1993 | Mattson et al. ......... | 219/121.43 |
| 5,217,501 A | 6/1993 | Fuse et al. | |
| 5,337,207 A | 8/1994 | Jones et al. | |
| 5,356,833 A | 10/1994 | Maniar et al. | |
| 5,545,289 A | 8/1996 | Chen et al. | |
| 5,571,367 A | 11/1996 | Nakajima et al. | |
| 5,641,702 A | 6/1997 | Imai et al. | |
| 5,840,200 A | 11/1998 | Nakagawa et al. | |
| 6,000,227 A | 12/1999 | Kroeker | |
| 6,136,211 A | 10/2000 | Qian et al. | |
| 6,148,072 A | 11/2000 | Huang | |
| 6,204,141 B1 | 3/2001 | Lou | |
| 6,228,739 B1 | 5/2001 | Ha et al. | |
| 6,267,074 B1 | 7/2001 | Okumura | |
| 6,270,568 B1 | 8/2001 | Droopad et al. | |
| 6,270,582 B1 | 8/2001 | Rivkin et al. | |
| 6,297,095 B1 | 10/2001 | Muralidhar et al. | |
| 6,300,202 B1 | 10/2001 | Hobbs et al. | |
| 6,300,212 B1 | 10/2001 | Inoue et al. | |
| 6,319,730 B1 | 11/2001 | Ramdani et al. | |
| 6,326,261 B1 | 12/2001 | Tsang et al. | |
| 6,335,207 B1 | 1/2002 | Joo et al. | |
| 6,348,386 B1 | 2/2002 | Gilmer | |
| 6,358,859 B1 | 3/2002 | Lo et al. | |
| 6,399,507 B1 * | 6/2002 | Nallan et al. ................. | 438/706 |
| 6,414,280 B1 | 7/2002 | Nishitani et al. | |
| 6,440,864 B1 | 8/2002 | Kropewnicki et al. | |
| 6,458,253 B2 | 10/2002 | Ando et al. | |
| 6,479,801 B1 | 11/2002 | Shigeoka et al. | |
| 6,485,988 B2 | 11/2002 | Ma et al. | |
| 6,514,378 B1 | 2/2003 | Ni et al. | |
| 6,528,427 B2 | 3/2003 | Chebi et al. | |
| 6,635,185 B2 | 10/2003 | Demmin et al. | |
| 6,890,861 B1 | 5/2005 | Bosch | |
| 7,506,654 B2 * | 3/2009 | Chandran et al. ............. | 134/1.1 |
| 7,695,232 B2 | 4/2010 | Moore et al. | |
| 7,846,845 B2 | 12/2010 | Bahng et al. | |
| 2001/0055852 A1 | 12/2001 | Moise et al. | |
| 2002/0074312 A1 | 6/2002 | Ou-Yang et al. | |
| 2003/0170986 A1 | 9/2003 | Nallan et al. | |
| 2004/0002223 A1 | 1/2004 | Nallan et al. | |
| 2004/0007561 A1 | 1/2004 | Nallan et al. | |
| 2004/0043544 A1 | 3/2004 | Asai et al. | |
| 2004/0203251 A1 * | 10/2004 | Kawaguchi et al. .......... | 438/727 |
| 2005/0208714 A1 | 9/2005 | Yamazaki et al. | |
| 2007/0062558 A1 * | 3/2007 | Suzuki et al. ................. | 134/1.2 |
| 2009/0014324 A1 * | 1/2009 | Kawaguchi et al. ...... | 204/298.35 |
| 2009/0127102 A1 * | 5/2009 | Lee et al. ................. | 204/192.38 |

FOREIGN PATENT DOCUMENTS

| | | | |
|---|---|---|---|
| JP | 5-326477 | A | 12/1993 |
| WO | WO-0151072 | A2 | 7/2001 |
| WO | WO-0197257 | A2 | 12/2001 |

OTHER PUBLICATIONS

Songlin Xu and Li Diao, "Study of tungsten oxidation in $H_2/H_2/N_2$ downstream plasma", J. Vac. Sci. Technol. A 26(3), May/Jun. 2008.

\* cited by examiner

*Primary Examiner* — Michael Kornakov
*Assistant Examiner* — Natasha Campbell
(74) *Attorney, Agent, or Firm* — Patterson & Sheridan, LLP

(57) ABSTRACT

Methods for removing halogen-containing residues from a substrate are provided. By combining the heat-up and plasma abatement steps, the manufacturing throughput can be improved. Further, by appropriately controlling the pressure in the abatement chamber, the removal efficiency can be improved as well.

6 Claims, 3 Drawing Sheets

METHOD FOR REMOVING HALOGEN-CONTAINING RESIDUES FROM SUBSTRATE

CROSS-REFERENCE TO RELATED APPLICATION

This application claims benefit of U.S. Provisional Application Ser. No. 61/448,032, filed Mar. 1, 2011 which is incorporated by reference in its entirety.

BACKGROUND OF THE INVENTION

1. Field of the Invention

The present invention relates to methods for removing halogen-containing residues from a substrate.

2. Description of the Prior Art

Ultra-large-scale integrated (ULSI) circuits may include more than one million electronic devices that are formed on a semiconductor substrate, such as a silicon substrate, and cooperate to perform various functions within the devices. Typically, the transistors used in the ULSI circuits are complementary metal-oxide-semiconductor (CMOS) field effect transistors. A CMOS transistor has a gate structure including a polysilicon gate electrode and gate dielectric, and is disposed between a source region and drain regions that are formed in the substrate. Such formation of integrated circuits involves sequentially forming or depositing multiple electrically conductive and insulative layers in or on the substrate. Etching processes may be used to form geometric patterns in the layers or vias for electrical contact between the layers. General etching processes include wet etching, in which one or more chemical reagents are brought into direct contact with the substrate, and dry etching, such as plasma etching.

Plasma etching is commonly used in the fabrication of transistors and other electronic devices. During plasma etching processes used to form transistor structures, one or more layers of a film stack (e.g., layers of silicon, polysilicon, hafnium dioxide ($HfO_2$), silicon dioxide ($SiO_2$), metal materials, and the like) are typically exposed to etchants including at least one halogen-containing gas, such as hydrogen bromide (HBr), chlorine ($Cl_2$), carbon tetrafluoride ($CF_4$), and the like. Such processes induce halogen-containing residues to build up on the surfaces of the etched features, etch masks, and elsewhere on the substrate.

When exposed to a non-vacuumed environment (e.g., within factory interfaces or substrate storage cassettes) and/or during consecutive processing, gaseous halogens and halogen-based reactants (e.g., bromine ($Br_2$), chlorine ($Cl_2$), hydrogen chloride (HCl), and the like) may be released from the halogen-containing residues deposited during etching. The released halogens and halogen-based reactants create particle contamination and cause corrosion of the interior of the processing systems and factory interfaces, as well as corrosion of exposed portions of metallic layers on the substrate. Cleaning of the processing systems and factory interfaces and replacement of the corroded parts is a time consuming and expensive procedure. In addition to corroding the factory interface over time, the volatile chemicals outgassing from untreated wafers will damage the photoresist on unetched wafers in the FOUP. Corrosion to the factory interface is a long term problem, however, the damage to unetched wafers is immediate Therefore, methods for removing the halogen-containing residues after the etching process are needed. Moreover, the efficiency of the removal process is also important so as not to reduce the manufacturing throughput.

SUMMARY OF THE INVENTION

Methods for removing halogen-containing residues from a substrate are provided. By combining the heat-up and plasma abatement steps, the manufacturing throughput can be improved. Further, by appropriately controlling the pressure in the abatement chamber, the removal efficiency can be improved as well.

In one embodiment, a method for removing halogen-containing residues from a substrate in a chamber includes heating the substrate, forming a plasma in the chamber, and raising a pressure in the chamber after the plasma is formed.

In another embodiment, a method for removing halogen-containing residues from a substrate in a chamber includes heating the substrate, forming a plasma in the chamber, and controlling a pressure in the chamber below a pressure limit that extinguishes the plasma.

The objective of the present invention will no doubt become obvious to those of ordinary skill in the art after reading the following detailed description of the preferred embodiment, which is illustrated in the following figures and drawings.

BRIEF DESCRIPTION OF THE APPENDED DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides methods for removing halogen-containing residues from a substrate. The methods according to the invention can be widely applied to and implemented in various kinds of semiconductor processing systems providing the function of removing halogen-containing residues from a substrate.

Figure 1:
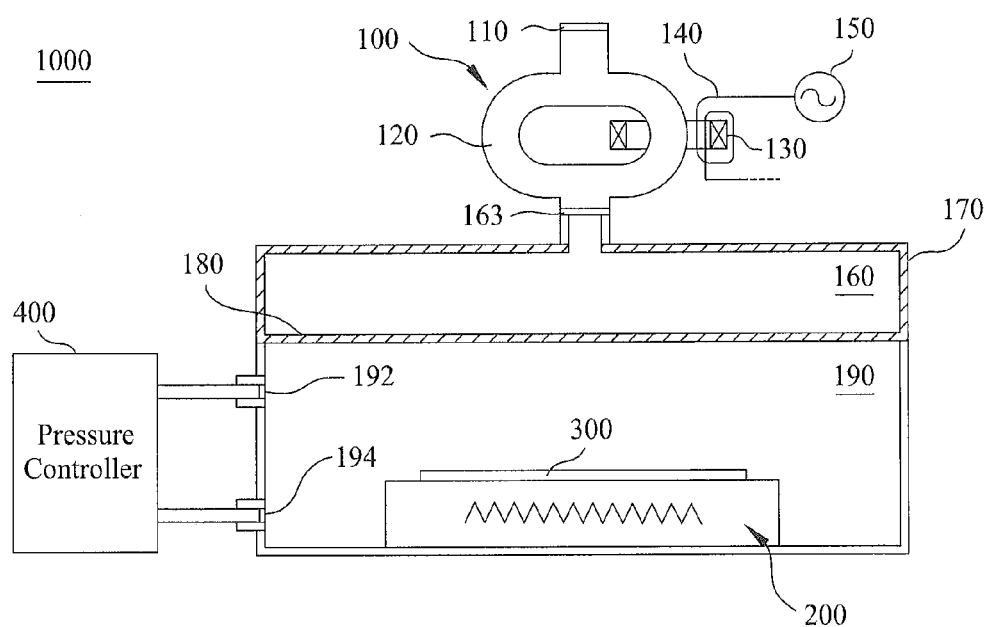
FIG. 1 shows a pictorial representation of an abatement chamber in one embodiment according to the present invention.

In one embodiment, the semiconductor processing system includes an abatement chamber for removing halogen-containing residues from etched substrates. FIG. 1 shows a pictorial representation of the abatement chamber 1000. As shown in FIG. 1, the abatement chamber 1000 includes a remote plasma source 100 (e.g., a microwave or an RF energy-based source). A precursor gas, for example, and without limitation, $H_2O_2$, is input through an entrance orifice 110 into a tube 120. In other embodiments, the precursor gas can also be, but not limited to, a mixture of $H_2O_2$ and Ar, a mixture of $O_2$, $N_2$, and $H_2O_2$, a mixture of $O_2$ and $N_2$, or a mixture of $O_2$, $N_2$ and $H_2$.

The tube 120 is surrounded by a ferrite core 130, and wires 140 surround at least a portion of the ferrite core 130. RF energy supplied by an RF power supply 150 is inductively coupled to precursor gases flowing into and through the tube 120 to generate plasma therein. Plasma species generated in the tube 120 flow through the exit tube 163, and enter the gas distribution plenum 160. As shown in FIG. 1, the exit tube 163 and gas distribution plenum 160 include liners 170 for reducing recombination of the plasma species generated by the remote plasma source 100. The Gas distribution plate 180 forms a bottom portion of the gas distribution plenum 160. In one embodiment, the gas distribution plate 180 is a perforated plate or a showerhead, and as such, advantageously provides good flow uniformity of gas into the processing chamber 190. A plasma can also be generated in the processing chamber 190 to enhance abatement rates over those obtained by use of the remote plasma source 100 alone.

As further shown in FIG. 1, the abatement chamber 1000 includes a wafer pedestal 200. An etched substrate 300 is transferred into and out of the processing chamber 190 by a robot arm from/to a transfer chamber (not shown). In the abatement process, the wafer pedestal 200 heats the etched substrate 300 and converts the halogen-containing residues therein into non-volatile compounds which may be pumped out of the processing chamber 190. Further, the dissociated ions and species in the plasma generated by the remote plasma source 100 can promote the conversion of the out-gassed halogen-based reactants into non-corrosive volatile compounds, thereby increasing the removal efficiency of the halogen-containing residues from the etched substrate 300.

According to the method in one embodiment of the invention, the remote plasma source 100 strikes the plasma while the etched substrate 300 is heated. Subsequently, the etched substrate 300 is exposed to the plasma and heated at the same time. In other words, the heat-up and plasma abatement steps are combined. For instance, the plasma can be stricken when the wafer pedestal 200 starts to heat the etched substrate 300. Subsequently, the plasma is maintained in part or all of the duration that the wafer pedestal 200 heats the etched substrate 300. In this way, the abatement efficiency can be improved in comparison with that obtained when the heat-up and plasma abatement steps are performed separately. Thereby, the removal process will take less time and the manufacturing throughput of the semiconductor processing system will not be reduced.

As shown in FIG. 1, the abatement chamber 1000 also includes a pressure controller 400 for controlling the pressure in the processing chamber 190 by venting or evacuating the processing chamber 190 through the orifices 192/194 formed on the chamber wall. The pressure inside the processing chamber 190 may be controlled within a predetermined range that facilitates performing the halogen-containing residues removal process. According to the method in one embodiment of the invention, the precursor gas is provided to strike the plasma at a lower pressure, for example, 0.5 Torr to about 1 Torr. After the plasma is formed, the pressure controller 400 raises the pressure in the processing chamber 190. Because a higher pressure allows for better heat transfer within the processing chamber 190, it is easier to drive off the halogen-containing residues from the etched substrate 300 at a higher pressure. In other words, while the etched substrate 300 is heated, raising the pressure in the processing chamber 190 can enhance the removal efficiency. As described above, the heat-up and plasma abatement steps are performed simultaneously. In one embodiment, after the plasma has been ignited, the pressure controller 400 raises the pressure in the processing chamber 190 up to a higher pressure, for example, 4 Torr to 10 Torr.

According to experiments, the plasma cannot be ignited but can still be maintained after the pressure is raised above a specific pressure. Further, the plasma will extinguish at a pressure higher than the specific pressure. To prevent the plasma from being extinguished by high pressure, after the plasma is stricken, the pressure controller 400 controls the pressure in the processing chamber 190 below a pressure limit that extinguishes the plasma. According to the method in one embodiment of the invention, the precursor gas is provided at a lower pressure to strike the plasma, then the pressure controller 400 raises the pressure as high as possible without extinguishing the plasma.

Figure 2:
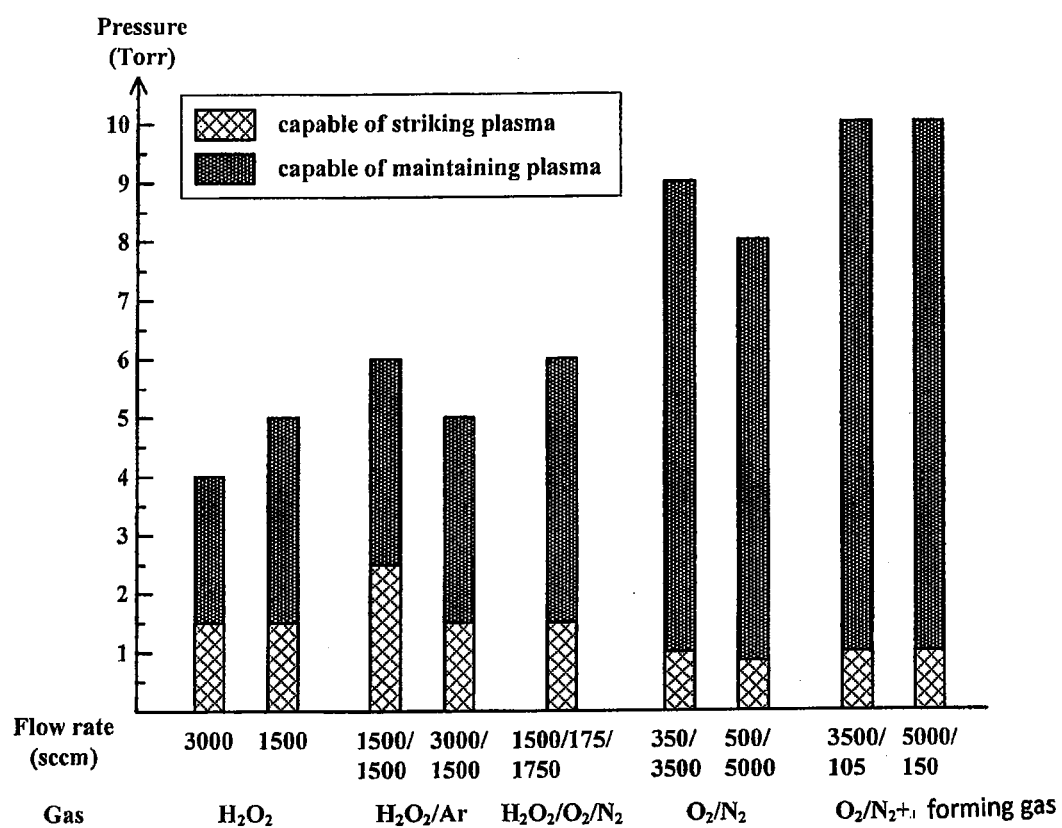
FIG. 2 shows experimental relationships between pressure range and plasma status.

As described above, the precursor gas for forming the plasma can be, for example, but not limited to, $H_2O$ vapor, $H_2O_2$, a mixture of $H_2O_2$ and Ar, a mixture of $O_2$, $N_2$, and $H_2O_2$, a mixture of $O_2$ and $N_2$, or a mixture of $O_2$, $N_2$ and $H_2$. The aforementioned pressure limit is related to the type of the precursor gas. FIG. 2 shows experimental relationships between pressure range and plasma status; several kinds of precursor gases are tested. Taken the condition that the precursor gas is a mixture of $H_2O_2$ and Ar for example, when the flow rate of $H_2O_2$ and Ar are respectively 3000 sccm and 1500 sccm, the pressure limit that extinguishes the plasma is about 5 Torr. Also as shown in FIG. 2, at a pressure higher than 1.5 Torr, a plasma formed from $H_2O_2$ and Ar cannot be ignited. Accordingly, the pressure controller 400 can determines the pressure limit based on the type of the precursor gas. For instance, if the precursor gas is a mixture of $H_2O_2$ and Ar, the pressure controller 400 can first provide a pressure lower than 1 Torr in the processing chamber 190 before the plasma is formed. After the plasma has been ignited, the pressure controller 400 raises the pressure so as to improve the removal efficiency but controls the pressure below 5 Torr so as to maintain the plasma. In one example, the $H_2O$ vapor effectively removes halogen residues originating from a halogen-based tungsten etch process with substantially no sidewall damage and no surface oxidation of the tungsten, which advantageously helps maintain critical dimensions in features etched in tungsten, such as tungsten gate electrodes.

In the embodiment shown in FIG. 1, the pressure controller 400 is disposed at the left side of the processing chamber 190. Practically, the pressure controller 400 may also be positioned at other places, for example, but not limited to, above the processing chamber 190.

Figure 3:
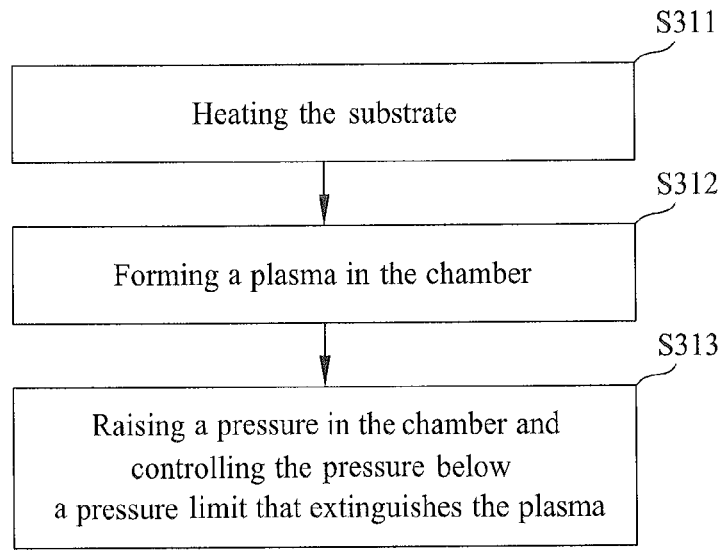
FIG. 3 depicts the flowchart of a method according to the present invention.

FIG. 3 illustrates the flowchart of the method for removing halogen-containing residues from a substrate in a chamber in one embodiment according to the invention. The method can be configured to perform in the abatement chamber 1000 described in FIG. 1. It is contemplated that the method may be performed in other suitable semiconductor processing systems, including those from other manufacturers.

As shown in FIG. 3, the method begins at S311 by heating the substrate. At S312, a plasma is formed in the chamber while the substrate is still heated. At S313, a pressure in the chamber is raised but controlled below a pressure limit that extinguishes the plasma. As described above, the raised pressure can improve the removal efficiency. In another embodiment, heating the substrate can be performed after the plasma is formed. That is to say, the performing sequence of S311 and S312 can be exchanged. No matter what the performing sequence is, after the plasma is formed, the pressure is raised to enhance the removal efficiency.

Figure 4:
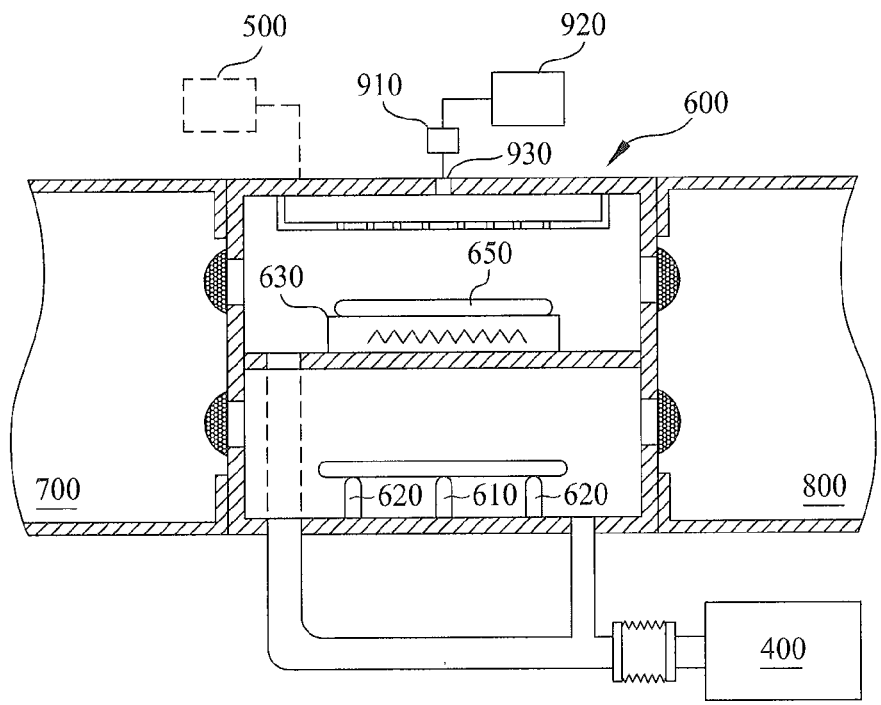
FIG. 4 shows a pictorial representation of a load lock chamber in one embodiment according to the present invention.

In another embodiment, the method according to the invention is applied in a semiconductor processing system including a load lock chamber for removing volatile residues from a substrate. FIG. 4 shows a pictorial representation of the load lock chamber 600. A factory interface 700 is coupled to a transfer chamber 800 by the load lock chamber 600. The transfer chamber 800 is further coupled between a plurality of processing chambers (not shown) and the load lock chamber 600. The factory interface 700 is configured to transfer substrates to the processing chambers for processing through the load lock chamber 600 and the transfer chamber 800.

In one embodiment, at least one of the process chambers is an etch chamber. The etch chambers may use a halogen-containing gas to etch the substrates therein. Examples of halogen-containing gas include hydrogen bromide (HBr), chlorine ($Cl_2$), carbon tetrafluoride ($CF_4$), and the like. After etching the substrate, halogen-containing residues may be left on the substrate surface and may be removed by a thermal treatment process in the load lock chambers 600. The first substrate holder 620 on the substrate pedestal 610 is utilized to hold an unprocessed substrate from the factory interface 700 while the second substrate holder 630 is utilized to hold a processed substrate (e.g., an etched substrate) returning from the transfer chamber 800.

The heater module 500 positioned above the load lock chamber 600 may include various types of radiant heaters. During halogen-containing residue removal process, the substrate pedestal 630 may raise the processed substrate toward the heater module 500 to increase heating efficiency, thereby converting the halogen-containing residues to non-volatile compounds that may be pumped out of the load lock chamber 600. A remote plasma source 910 is coupled to the vent passage 930 to assist in removing the halogen-containing residues from the substrate surfaces. The remote plasma source 910 provides plasma formed from a precursor gas provided by the gas source 920. The precursor gas for forming the plasma can be, for example, but not limited to, $H_2O$ vapor, $H_2O_2$, a mixture of $H_2O_2$ and Ar, a mixture of $O_2$, $N_2$, and $H_2O_2$, a mixture of $O_2$ and $N_2$, or a mixture of $O_2$, $N_2$ and $H_2$.

A pressure controller 400 is used to pump down and vent the load lock chamber 600 to facilitate passing substrates between the vacuum environment of the transfer chamber 800 and the substantially atmospheric environment of the factory interface 700. Furthermore, the pressure controller 400 controls the pressure in the load lock chamber 600 within a predetermined range that facilitates performing the halogen-containing residues removal process. In one embodiment, the pressure controller 400 controls the pressure at a lower level, for example, 0.5 Torr to about 1 Torr, when the precursor gas is provided to strike the plasma. After the plasma is formed, the pressure controller 400 raises the pressure in the load lock chamber 600. The higher pressure allows for better heat transfer within the load lock chamber 600. As described above, while the processed substrate 650 is heated, raising the pressure in the load lock chamber 600 can enhance the removal efficiency. In one embodiment, after the plasma has been ignited, the pressure controller 400 raises the pressure in the load lock chamber 600 up to a higher pressure, for example, 10 Torr.

To prevent the plasma from being extinguished by high pressure, after the plasma is ignited, the pressure controller 400 controls the pressure in the load lock chamber 600 below a pressure limit that extinguishes the plasma. In one embodiment, the precursor gas is provided at a lower pressure to strike the plasma, then the pressure controller 400 raises the pressure in the load lock chamber 600 as high as possible without extinguishing the plasma.

In other embodiments, the methods according to the present invention can also be performed in semiconductor processing systems including double-decked chambers. The methods according to the invention can be widely applied to and implemented in various kinds of semiconductor processing systems providing the function of removing halogen-containing residues from a substrate. For example, the methods according to the invention can also be performed after a deposition process with a $Cl_2$ containing process gas in a CVD or PVD chamber.

As described above, the present invention provides methods and systems for removing halogen-containing residues from a substrate. By combining the heat-up and plasma abatement steps, the manufacturing throughput can be improved. Further, by appropriately controlling the pressure in the abatement chamber, the removal efficiency can be improved as well.

While the foregoing is directed to embodiments of the present invention, other and further embodiments of the invention may be devised without departing from the basic scope thereof, and the scope thereof is determined by the claims that follow.

What is claimed is:
1. A method for removing halogen-containing residues from a substrate in a chamber, comprising:
    heating the substrate;
    exposing the substrate to reactive species generated by a plasma;
    raising a pressure in the chamber, in the presence of the plasma, after the plasma is generated;
    continuing to expose the substrate to reactive species, in the presence of the plasma, after raising the pressure;
    controlling the pressure in the chamber to below the pressure that extinguishes the plasma; and
    removing the halogen-containing residues from the substrate in the chamber.
2. The method of claim 1, wherein exposing and the controlling occur during the heating.
3. The method of claim 2, further comprising flowing one or more precursor gases into the chamber, wherein the precursor gases comprise $H_2O_2$, a mixture of $H_2O_2$ and Ar, a mixture of $O_2$, $N_2$, and $H_2O_2$, a mixture of $O_2$ and $N_2$, or a mixture of $O_2$, $N_2$ and $H_2$.
4. The method of claim 1, wherein the plasma is generated in a remote plasma source.
5. The method of claim 1, wherein the exposing and the heating begin at the same time.
6. The method of claim 1, wherein, prior to raising the pressure, the chamber is at a pressure wherein a plasma can be ignited, and wherein after raising the pressure, the chamber is at a pressure greater than a pressure wherein a plasma can be ignited but lower than a pressure that will extinguish the plasma.

* * * * *